United States Patent [19]

Tsang

[11] Patent Number: 5,208,824
[45] Date of Patent: May 4, 1993

[54] ARTICLE COMPRISING A DFB SEMICONDUCTOR LASER

[75] Inventor: Won-Tien Tsang, Holmdel, N.J.

[73] Assignee: AT&T Bell Laboratories, Murray Hill, N.J.

[21] Appl. No.: 806,969

[22] Filed: Dec. 12, 1991

[51] Int. Cl.$^5$ .............................................. H01S 3/19
[52] U.S. Cl. ...................................... 372/96; 372/45
[58] Field of Search ..................... 372/96, 45, 44, 46

[56] References Cited

U.S. PATENT DOCUMENTS 5,077,752 12/1991 Tada et al. ............................ 372/96

OTHER PUBLICATIONS

"Coupled-Wave Theory of Distributed Feedback Lasers", by H. Kogelnik et al, *Journal of Applied Physics*, vol. 43, No. 5, May 1972, pp. 2327-2335.
"Purely Gain-Coupled Distributed Feedback Semiconductor Lasers", by Y. Luo et al, Applied Physics Letters, vol. 56 (17), Apr. 23, 1990, pp. 1620-1622.
"Fabrication and Characteristics of Gain-Coupled Distributed Feedback Semiconductor Lasers With a Corrugated Active Layer", by Y. Luo et al, IEEE *Journal of Quantum Electronics*, vol. 27, No. 6, Jun. 1991, pp. 1724-1730.
"CW Operation of an InGaAsP/InP Gain-Coupled Distributed Feedback Laser With a Corrugated Active Layer", by T. Inoue et al, IEEE *Transactions Photonics Technology Letters*, vol. 3, No. 11, Nov. 1991, pp. 958-960.
"1.55 μm Gain-Coupled Quantum-Well Distributed Feedback Lasers With High Single-Mode Yield and Narrow Linewidth", by B. Borchert et al., IEEE *Transactions Photonics Technology Letters*, vol. 3, No. 11, Nov. 1991, pp. 955-957.
"Facet Reflection Independent, Single Longitudinal Mode Oscillation in a GaAlAs/GaAs Distributed Feedback Laser Equipped With a Gain-Coupling Mechanism", by Y. Nakano, *Applied Physics Letters*, vol. 55 (16), Oct. 16, 1989, pp. 1606-1608.

*Primary Examiner*—James W. Davie
*Attorney, Agent, or Firm*—E. E. Pacher

[57] ABSTRACT

DFB lasers with advantageously structured grating region are disclosed. The grating region comprises one or more thin semiconductor layers (to be referred to as "QWs"), with the QWs varying periodically in the longitudinal direction of the laser. In an exemplary preferred embodiment the AWs are patterned during grating etch, with the topmost grating QW being covered with a layer of substantially the substrate composition. The structure inter alia facilitates defect-free epitaxial growth on the corrugated etched surface and also facilitates growth of the coupling coefficient κ. Furthermore, lasers according to the invention can be partially or purely gain coupled, resulting in desirable wavelength discrimination.

8 Claims, 3 Drawing Sheets

ARTICLE COMPRISING A DFB SEMICONDUCTOR LASER

FIELD OF THE INVENTION

This application pertains to semiconductor lasers that comprise a "grating" structure. All such laser types are herein collectively designated as distributed feedback (DFB) lasers.

BACKGROUND OF THE INVENTION

It is well known that DFB semiconductor lasers can have many advantageous features (e.g., extremely narrow-band emission) that make them desirable for, inter alia, optical fiber communications. However, there generally are at present two major technological problems in the manufacture of such lasers. One is the reproducible control of the optical feedback coupling coefficient κ, and the other is the discrimination of one definite oscillation wavelength out of the two possible oscillations at the edges of the Bragg reflection band.

The former problem is known to have a very significant effect on laser characteristics, e.g., spectral linewidth, harmonic distortion, and intensity noise, and thus can seriously affect manufacturing yield. The latter, if uncontrolled, can substantially reduce the fraction of devices having a specified wavelength, and thus also affects manufacturing yield.

One known approach to addressing the oscillation wavelength degeneracy problem in index-coupled DFB lasers is the use of antireflection/high reflectivity (AR/HR)-coated facets. This, however, can also cause a yield problem due to the phase uncertainty at the facets. Another approach is the incorporation of a λ/4 or corrugation pitch modulated phase shift. For perfect AR coatings, DFB lasers could in principle be produced with high yield, but the yield deteriorates rapidly for (typically encountered) reflectivities of a few percent. Furthermore, such lasers waste substantially half of the power by emission through the back facet, and can exhibit high spatial hole burning, which typically gives rise to optical non-linearity in the light-current curves, increased spectral linewidth, and a less flat frequency modulation response.

An alternative approach to the wavelength degeneracy problem is the introduction of gain coupling. See H. Kogelnik et al., *Journal of Applied Physics*, Vol. 43, p. 2327 (1972). Theory predicts that a purely gain coupled laser should have one lasing mode exactly at the Bragg wavelength for AR-coated facets (thereby solving the degeneracy problem), and that even a small degree of gain coupling can be advantageous for both AR-coated and non-AR-coated lasers. The validity of the gain-coupled approach has recently been demonstrated in GaAs/AlGaAs DFE lasers. See Y. Luo et al., *Applied Physics Letters*, Vol. 56(17), p. 1620 (1990); Y. Luo et al., *IEEE Journal of Quantum Electronics*, Vol. 27(6), p. 1724 (1991). These papers disclose a DFB laser comprising an active layer of periodically varying thickness. This is achieved through etching of a conventional grating of period Λ into the surface of an appropriate multi-layer semiconductor body, growing a buffer layer over the grating such that the exposed buffer layer surface is corrugated (with period Λ), and growing the active layer on the exposed corrugated buffer layer surface such that the active layer surface is flat. This clearly is a complicated procedure that cannot easily be incorporated into a manufacturing process. See also T. Inoue et al., *IEEE Transactions Photonics Technology Letters*, Vol. 3(11), p. 958 (1991), which also discloses a gain coupled DFB laser with a corrugated active layer.

A different approach is disclosed in B. Borchert et al., *IEEE Transactions Photonics Technology Letters*, Vol. 3(11), p. 955 (1991) and Y. Nakano et al., *Applied Physics Letters*, Vol. 55(16), p. 1606 (1989). Both papers disclose gain-coupled DFB lasers comprising a periodic loss structure that is spaced apart from the active region of the laser.

Although there are now known techniques that address at least one of the above referred-to two problems, the techniques generally are complicated and/or not fully effective. For instance, the gain-coupled DFB lasers of the two last cited papers have relatively complex structures that address only the mode degeneracy problem but do not address the coupling constant control problem.

In view of the importance of increasing the manufacturing yield of acceptable DFB lasers it would be very desirable to have available a simple laser design that can reliably overcome the above referred-to two problems. This application discloses such a design.

GLOSSARY

A "quantum well" herein is a thin semiconductor region of first composition and thickness t, sandwiched between semiconductor material of a second composition, with the compositions selected such that the relevant bandgap energy $E_{g1}$ of the first composition is less than the bandgap energy $E_{g2}$ of the second composition, and t furthermore is selected such that free carriers in the quantum well exhibit quantum effects, e.g., the lowest bound energy level associated with the well does not coincide with the relevant band edge of the well material. Typically, t is less than about 30 nm.

THE INVENTION

In a broad aspect the invention is an article (e.g., an optical fiber transmitter or transceiver, or an optical fiber communications system that comprises such a transmitter or receiver) that comprises a novel DFB semiconductor laser having features that, inter alia, can result in substantially improved laser manufacturing yield.

More particularly, the inventive DFB laser comprises a semiconductor body that comprises a multiplicity of epitaxial semiconductor layers on a semiconductor substrate. The semiconductor body comprises a periodically varying first region (the "grating" region) having a period Λ (in the longitudinal direction associated with the laser), and further comprises a second region (the "active" region) that is adapted for generation of electromagnetic radiation of a predetermined wavelength λ through electron-hole recombination and optical interaction with the grating. The active region is spaced apart from the grating region. The laser further comprises contact means that facilitate flowing an electrical current through the semiconductor body.

Significantly, in a laser according to the invention the grating region comprises one or more longitudinally varying (e.g., patterned) thin semiconductor layers of a first semiconductor composition, with a given first composition layer sandwiched between semiconductor material of a second composition. The first composition layers will be referred to herein as "quantum wells" or "QWs", although practice of the invention does not require that the layer thickness be such that the first composition layers exhibit the above described characteristics of a quantum well.

In an exemplary preferred embodiment the given QW is patterned such that, in at least a portion of the laser, the QW is divided into separate segments, with every segment measuring less than A in the longitudinal direction. The spacing between the active region and the grating region is such that, during normal lasing operation, radiation of wavelength $\lambda$ can interact with the grating.

Figure 1:
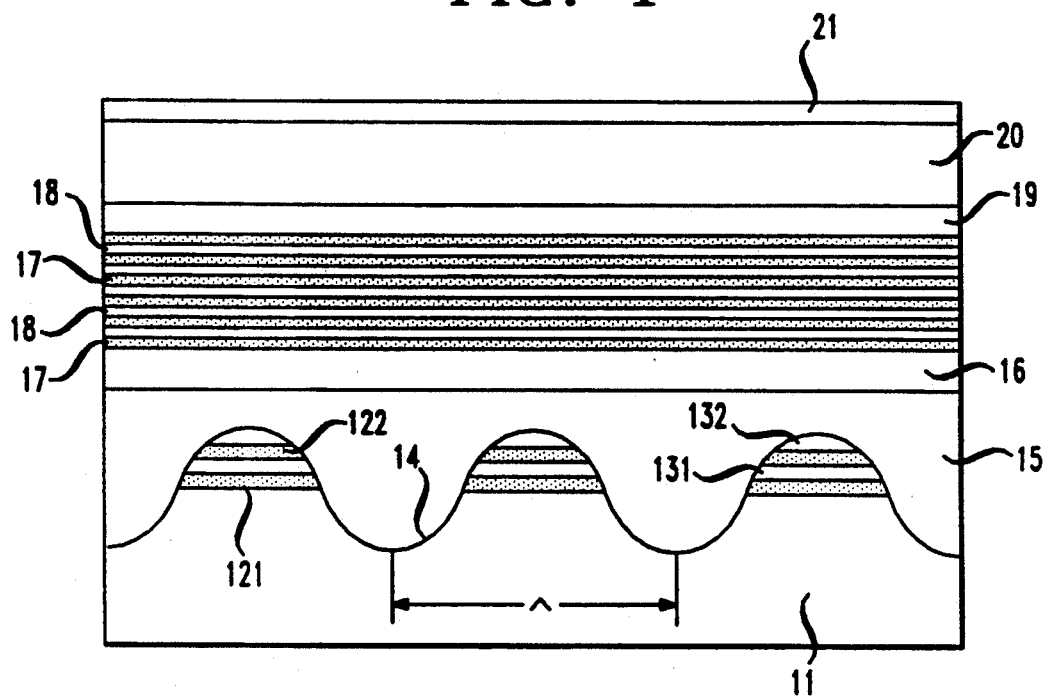
FIG. 1 schematically depicts relevant aspects of an exemplary embodiment of the invention.

FIG. 1 schematically depicts relevant aspects of an exemplary laser according to the invention. On substrate 11 (e.g., n+InP) are disposed QWs 121 and 122 (e.g., n-In$_y$Ga$_{1-y}$As, for all values of y referred to collectively as InGaAs), with barrier layer 131 (e.g., n−InP) therebetween. Advantageously, the QW structure is formed such that the top layer (132) has the barrier layer composition, with the barrier layer composition selected to be substantially the same as that of the immediately adjacent substrate material (excluding possible differences in doping level; an optional buffer layer or layers would, for purposes of this discussion, be considered to be part of the substrate).

The surface of the described multilayer structure is patterned by known means such that a Bragg grating of period A is formed, with the grating advantageously extending below the lowest QW layer. It is to be noted that in preferred embodiments the thus created corrugated surface 14 consists primarily of material of one composition (exemplarily InP), with only a minor amount of material of different composition (exemplarily InGaAs) exposed. This relative homogeneity of the surface facilitates growth of high quality epitaxial material of the same composition thereon, as will be appreciated by those skilled in the art.

On surface 14 is grown spacer layer 15 (e.g., n−InP), advantageously completely covering surface 14. On the spacer layer is disposed waveguide layer 16 (e.g., InGaAsP), followed by the active region that consists of a multiplicity of QWs 17 (e.g., In$_x$As; x not necessarily different from y), with barrier layers 18 (e.g., InGaAsP) therebetween. This is followed by waveguide layer 19 (e.g., InGaAsP), cladding layer 20 (e.g., p−InP), and cap layer 21 (e.g., p+InGaAsP). Contacts can be conventional and are not shown.

It will be understood that, except for the novel grating structure that comprises a QW (or QWs), lasers according to the invention can have conventional structure. The invention clearly applies to substantially all types of semiconductor DFB lasers, and is not limited to use in multi-quantum well DFB lasers. As those skilled in the art will have recognized, the invention can be embodied in DFB lasers wherein the grating is "below" the active region, as shown in FIG. 1, in lasers wherein the grating is "below" the active region, as well as in so-called "Distributed Bragg Reflector" (DBR) lasers in which the grating structure is laterally connected to the active region by an optical waveguide. The grating QWs optionally can be spaced such that the QWs are coupled, i.e., from a "superlattice". Herein we do not distinguish between coupled or not-coupled multi-QW structures, referring to them collectively as QW structures.

Use of the novel grating structure in a DFB laser can offer many advantages. For instance, because the QWs are thin, and preferably interleaved and capped with material that has substantially the same composition as the spacer layer and immediately adjacent substrate material, growth of the spacer layer over the grating surface is substantially an instance of homoepitaxial growth. This typically makes the epitaxial growth over the grating a trivial task, and can virtually insure freedom from defects. Furthermore, the coupling constant $\kappa$ typically can be conveniently controlled through appropriate choice of the number, composition and/or thickness of the QWs. The depth profile of the grating typically can be tailored by appropriate variation of QW composition and/or thickness, and/or barrier layer composition and/or thickness. Thus, I contemplate embodiments of my invention wherein the grating QWs are not all of the same thickness or composition, and/or wherein the grating barrier layers are not all of the same thickness or composition.

It is known that, for optimal laser performance, the quantity $\kappa L$ (where L is the cavity length) typically should be in the range 1-2. Thus, in many cases $\kappa$ desirably is quite small, attainable with just one or a few grating QWs. This in turn makes it possible to have gratings wherein all QWs are etched through, substantially as shown in FIG. 1. In such (preferred) lasers the actual grating depth plays no significant role in affecting $\kappa$, contrary to the situation that obtains in conventional DFB lasers. Thus, it is typically a relatively simple matter to control $\kappa$ in preferred lasers according to the invention.

Other advantageous features of lasers according to the invention are as follows. Because of the well-known quantum size effect in QWs, the grating QWs can be designed such that the absorption edge of the grating QWs is above the lasing wavelength, even if the same material composition is used in the active layer of the laser and in the grating QWs, thus simplifying manufacture. It will be noted that the resulting DFB laser is an index-coupled laser, and it may bear emphasizing that the instant invention can be embodied in index-coupled as well as in gain (loss)-coupled lasers, as well as in lasers that exhibit a combination of both these coupling mechanisms.

If a gain (loss)-coupled grating is desired, then the thickness and/or composition of the grating QWs can be selected such that the QW absorption edge is below the lasing wavelength. By making the grating QWs very thin the gain-coupling effect can be made to dominate over the index-coupling effect. If desired, the grating QWs can have a composition with narrower bulk bandgap than the relevant active region material. The grating QW composition can be selected such that the QWs are strained, either in tension or in compression. Those skilled in the art will appreciate that use of strained QWs can be used to modify the respective coupling coefficients of the TE and TM modes of a DFB laser according to the invention, thereby giving the device designer an additional degree of freedom.

The above discussion shows that the use of QWs in the grating region can greatly facilitate, inter alia, the reproducible re-growth of the grating and the control of the coupling coefficient. It can also provide a very convenient and effective scheme for achieving gain-coupled DFB lasers, and thus for removing the wavelength degeneracy.

A laser substantially as shown in FIG. 1 was made as follows. Two 4 nm thick n−$In_{0.62}Ga_{0.38}$ As layers, respectively separated and capped by 9.3 nm thick n−InP layers, were grown on a conventional (100) oriented 5 nm diameter n+InP substrate by conventional chemical beam epitaxy (CBE) at 545° C. First order gratings ($\Lambda$=240 nm) were prepared by conventional holographic techniques and wet etching. The grating depth was about 48 nm. After standard cleaning the wafer was re-introduced into the CBE system, and heated to about 545° C. under P over-pressure from pre-cracked $PH_3$. Under these conditions no observable grating erosion occurred. An n−InP spacer layer of thickness 65 nm (measured from the top of the grating) was grown, followed by growth of a standard strained-layer 6-QW separate confinement heterostructure (SCH). The quaternary ($Q_{1.25}$) waveguide layers were 52.2 nm thick, the $In_{0.6}Ga_{0.4}As$ QWs and $Q_{1.25}$ barrier layers were 5 nm and 18.6 nm, respectively. The wafer was then further conventionally processed into buried heterostructure lasers, including MO-VPE re-growth of Fe-doped InP at 630° C. Diethylzinc and tetraethyltin were employed as the p- and n-type doping sources, respectively.

Figure 2:
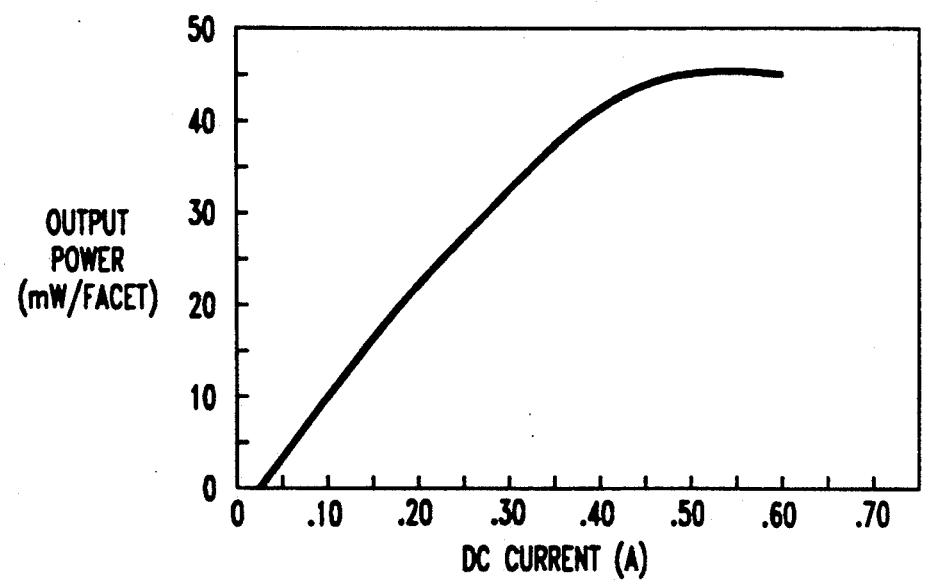
FIGS. 2–4 give data on output power vs. drive current, output intensity vs. wavelength, and side mode suppression ratio vs. drive current, respectively, all for an exemplary laser according to the invention.
Figure 3:
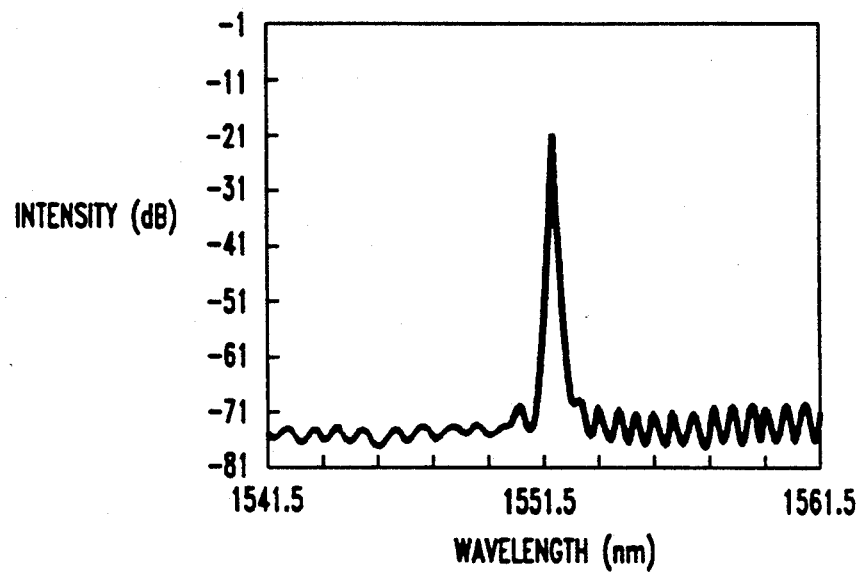
Figure 4:
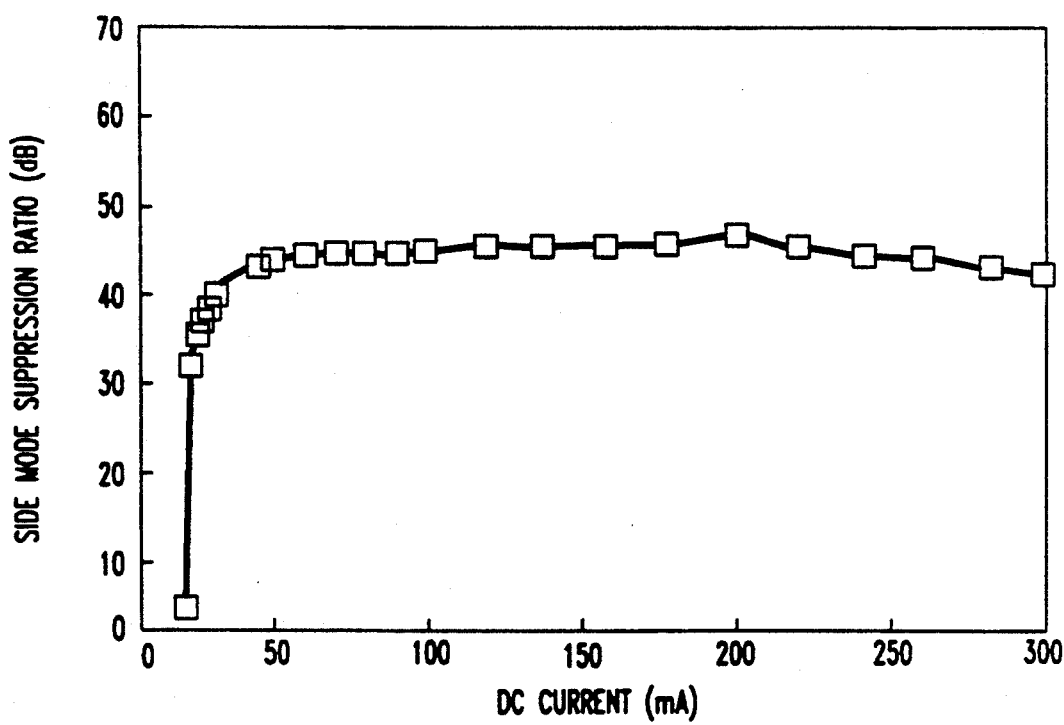

FIG. 2 shows exemplary data on laser output vs. drive current, FIG. 3 shows the lasing spectrum of the same laser, and FIG. 4 shows data on the side-mode-suppression-ratio (SMSR) vs. drive current, all for a 0.5 mm cavity length 2QW-grating laser produced substantially as described above, with (5%) AR-coating on both facets. AR coating is optional, and even as-cleaved lasers according to the invention can show high SMSR.

Figure 5:
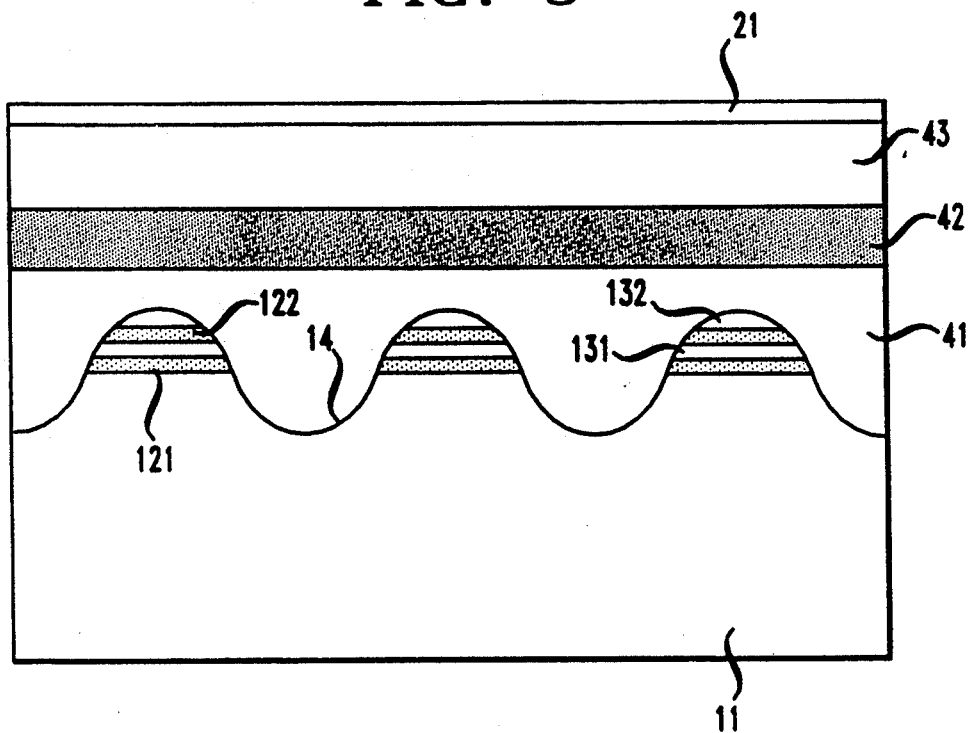
FIGS. 5 and 6 schematically depict two further exemplary embodiments of the invention.

FIG. 5 schematically depicts a further exemplary embodiment of the invention. On corrugated surface 14 is grown cladding layer 41 (e.g., n−Inp), active layer 42 (e.g., InGaAsP), cladding layer 43 (e.g., p−InP), and cap layer 21 (e.g., p+−InGaAs).

Figure 6:
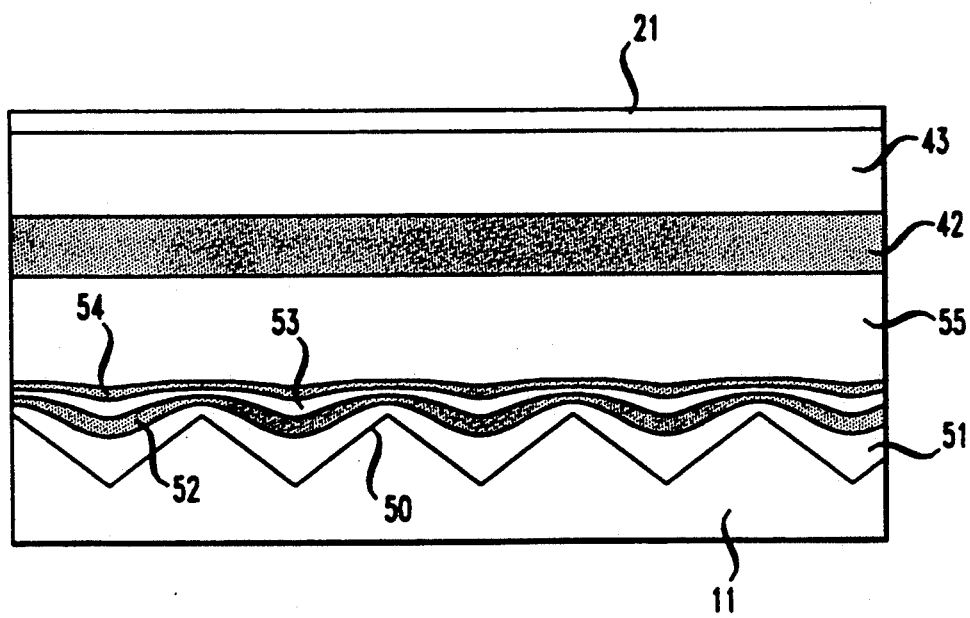

FIG. 6 schematically depicts a further exemplary (gain coupled) laser structure according to the invention. Substrate 11 (e.g., n+−InP) is etched to form corrugated surface 50. Onto the surface is deposited a thin layer 51 (e.g., n−InP), followed by deposition of QW layer 52 (e.g., n−InGaAs), barrier layer 53 (e.g., n−InP), further QW layer 54 (e.g., n−InGaAs), and cladding layer 55 (e.g., n−InP). Relevant deposition techniques result in layers that exhibit periodic thickness variations, as shown in FIG. 6. It will be appreciated that a grating of the type shown can be incorporated into substantially any of the laser types into which the previously discussed QW grating can be incorporated.

I claim:

1. An article comprising a DFB laser that comprises a semiconductor body comprising a multiplicity of epitaxial semiconductor layers on a semiconductor substrate comprising
   a) a periodically varying first semiconductor region (the "grating" region), associated with the grating region being a period $\Lambda$;
   b) a second semiconductor region (the "active" region) suitable for generation of electromagnetic radiation of wavelength $\lambda$ through electron-hole recombination therein, said active region being spaced apart from said grating region; and
   c) said laser further comprises contact means that facilitate flowing an electrical current through said semiconductor body; associated with said laser being a radiation emission direction;

CHARACTERIZED IN THAT
   d) said grating region comprises one or more semiconductor layers of a first composition, a given first composition layer being sandwiched between semiconductor material of a second composition and varying in said radiation emission direction with period $\Lambda$.

2. The article of claim 1, wherein said given first composition layer is patterned such that, in at least a portion of said laser, said given quantum well layer is divided into separate segments, with every segment measuring less than $\Lambda$ in said radiation emission direction.

3. The article of claim 1, wherein said given first composition layer exhibits a thickness variation of period $\Lambda$.

4. The article of claim 1, wherein said grating region is situated between said substrate and said active region.

5. The article of claim 1, wherein said active region is situated between said substrate and said grating region.

6. The article of claim 1, wherein said DFB laser is a Distributed Bragg Reflector laser.

7. The article of claim 1, wherein said semiconductor substrate is an InP substrate.

8. The article of claim 1, wherein said given first composition layer has a thickness t less than 30 nm.

* * * * *